(12) United States Patent
Abe et al.

(10) Patent No.: US 11,651,969 B2
(45) Date of Patent: May 16, 2023

(54) ETCHING METHOD, SEMICONDUCTOR MANUFACTURING APPARATUS, AND METHOD OF MANUFACTURING SEMICONDUCTOR DEVICE

(71) Applicant: Kioxia Corporation, Minato-ku (JP)

(72) Inventors: Chihiro Abe, Yokkaichi (JP); Toshiyuki Sasaki, Yokkaichi (JP); Hisataka Hayashi, Yokkaichi (JP); Mitsuhiro Omura, Nagoya (JP); Tsubasa Imamura, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/819,348

(22) Filed: Mar. 16, 2020

(65) Prior Publication Data
US 2021/0020450 A1    Jan. 21, 2021

(30) Foreign Application Priority Data

Jul. 18, 2019  (JP) .............................. JP2019-132868
Mar. 12, 2020  (JP) .............................. JP2020-042953

(51) Int. Cl.
| | | |
|---|---|---|
| *H01L 21/3065* | (2006.01) | |
| *H01L 21/311* | (2006.01) | |
| *H01L 21/67* | (2006.01) | |
| *H01L 21/02* | (2006.01) | |
| *H01J 37/32* | (2006.01) | |
| *H01L 27/11556* | (2017.01) | |
| *H01L 27/11582* | (2017.01) | |

(52) U.S. Cl.
CPC .. *H01L 21/31116* (2013.01); *H01J 37/32449* (2013.01); *H01J 37/32724* (2013.01); *H01L 21/0206* (2013.01); *H01L 21/67069* (2013.01); *H01J 2237/002* (2013.01); *H01J 2237/3341* (2013.01); *H01L 27/11556* (2013.01); *H01L 27/11582* (2013.01)

(58) Field of Classification Search
CPC ....................... H01L 21/3065; H01L 21/31116
See application file for complete search history.

(56) References Cited

U.S. PATENT DOCUMENTS 9,659,789 B2    5/2017  Takeda et al.
2006/0291823 A1*  12/2006  Su ..................... H01L 21/67115
                                                            392/318

(Continued)

FOREIGN PATENT DOCUMENTS

JP    2017-118091 A    6/2017
JP    2017-208387 A    11/2017

(Continued)

*Primary Examiner* — Thomas T Pham
(74) *Attorney, Agent, or Firm* — Oblon, McClelland, Maier & Neustadt, L.L.P.

(57) ABSTRACT

An etching method according to one embodiment, includes alternately switching a first step and a second step. The first step introduces a first gas containing a fluorine atom without supplying radiofrequency voltage to form a surface layer on a surface of a target cooled at a temperature equal to or lower than a liquefaction temperature of the first gas. The second step introduces a second gas gaseous at the first temperature and different from the first gas, and supplies the radiofrequency voltage, to generate plasma from the second gas to etch the target by sputtering using the plasma.

14 Claims, 16 Drawing Sheets

(56) References Cited

U.S. PATENT DOCUMENTS

| | | | |
|---|---|---|---|
| 2013/0119018 A1* | 5/2013 | Kanarik | H01J 37/32165 |
| | | | 216/67 |
| 2016/0196969 A1* | 7/2016 | Berry, III | H01L 21/31144 |
| | | | 438/694 |
| 2016/0233335 A1* | 8/2016 | Dasaka | H01L 21/02381 |
| 2016/0247688 A1* | 8/2016 | Zhu | H01J 37/32357 |
| 2017/0178921 A1 | 6/2017 | Takeda et al. | |
| 2017/0330759 A1 | 11/2017 | Gohira et al. | |
| 2017/0372916 A1* | 12/2017 | Kudo | H01J 37/32724 |
| 2018/0286707 A1* | 10/2018 | Hudson | H01J 37/32422 |
| 2020/0234962 A1* | 7/2020 | Kato | H01L 21/31116 |
| 2021/0151326 A1* | 5/2021 | Shimizu | H01L 21/67196 |

FOREIGN PATENT DOCUMENTS

| | | |
|---|---|---|
| JP | 2017-228690 A | 12/2017 |
| JP | 6408903 B2 | 10/2018 |
| TW | 201921482 A | 6/2019 |

* cited by examiner

ETCHING METHOD, SEMICONDUCTOR MANUFACTURING APPARATUS, AND METHOD OF MANUFACTURING SEMICONDUCTOR DEVICE

CROSS-REFERENCE TO RELATED APPLICATION

This application is based upon and claims the benefit of priority from Japanese Patent Application No. 2019-132868, filed on Jul. 18, 2019 and Japanese Patent Application No. 2020-42953, filed on Mar. 12, 2020; the entire contents of which are incorporated herein by reference.

FIELD

Embodiments relate to an etching method, a semiconductor manufacturing apparatus, and a method of manufacturing a semiconductor device.

BACKGROUND

In a method of manufacturing a semiconductor device such as a three-dimensional memory, there is known a technology for forming an opening in a target by etching using etching gas containing a fluorinated hydrocarbon compound.

DETAILED DESCRIPTION

Figure 1:
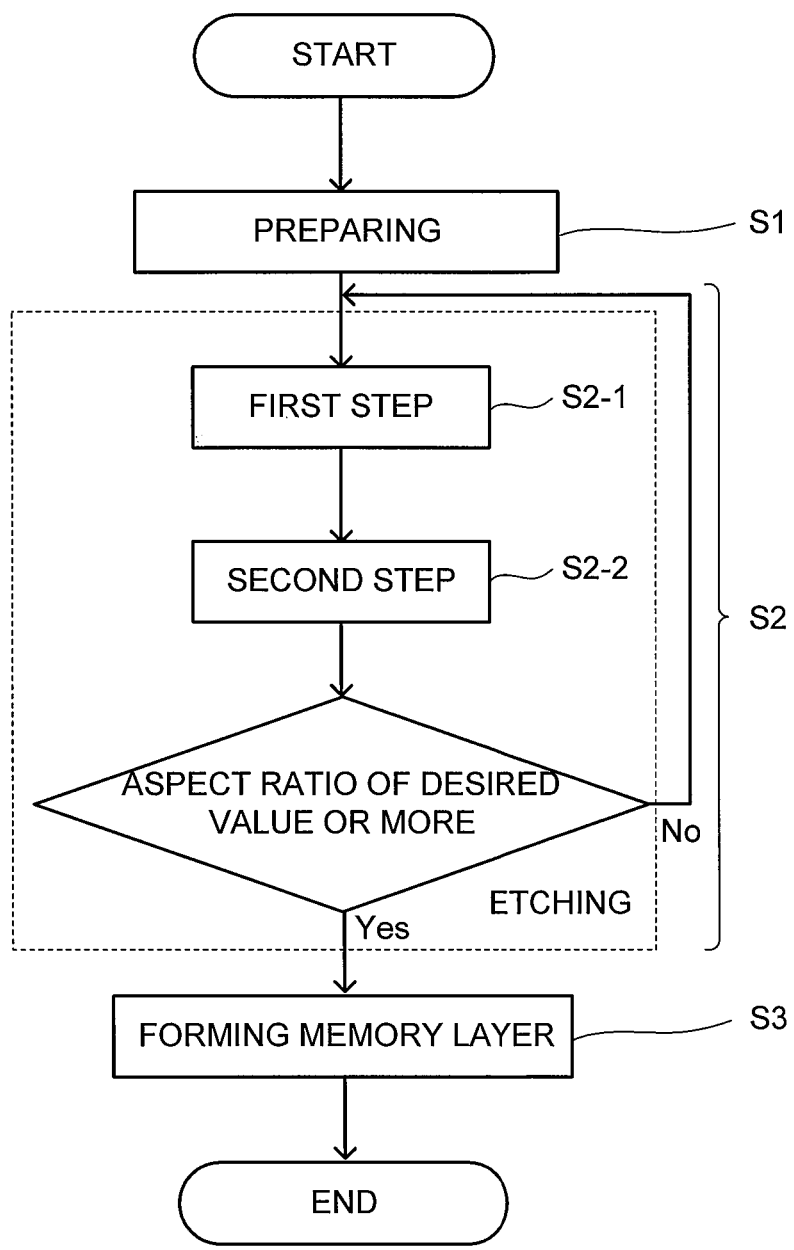
FIG. 1 is a flowchart for explaining an example of a method of manufacturing a semiconductor device.

An etching method according to one embodiment, includes alternately switching a first step and a second step. The first step introduces a first gas containing a fluorine atom without supplying radiofrequency voltage to form a surface layer on a surface of a target cooled at a temperature equal to or lower than a liquefaction temperature of the first gas. The second step introduces a second gas gaseous at the first temperature and different from the first gas, and supplies the radiofrequency voltage, to generate plasma from the second gas to etch the target by sputtering using the plasma.

Hereinafter, embodiments will be described with reference to the drawings. A relationship between a thickness and a plane dimension of each component, a ratio of the thickness of each component and so on which are indicated in the drawing are sometimes different from those of an actual thing. Further, in the embodiment, substantially the same component is given the same reference numeral and explanation will be omitted accordingly.

First Embodiment

FIG. 1 is a flowchart for explaining a method of manufacturing a semiconductor device. The semiconductor device is a three-dimensional memory, for example. An example of the method of manufacturing the semiconductor device includes a preparing process, (S1), an etching process (S2), and a memory layer forming process (S3).

[Preparing Process]

Figure 2:
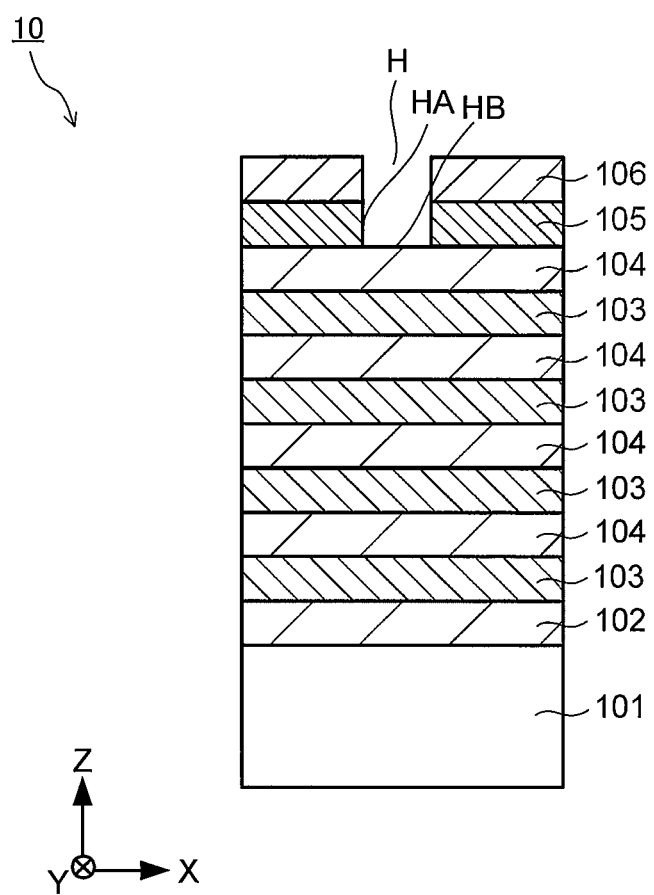
FIG. 2 is a cross-sectional schematic diagram illustrating a structure example of a target.

In the preparing process, a target being an object to be etched in the etching process is prepared. FIG. 2 is a cross-sectional schematic diagram illustrating a structure example of the target, which shows a part of an X-Z cross section that includes an X-axis and a Z-axis which is orthogonal to the X-axis and a Y-axis orthogonal to the X-axis of a substrate 101.

The target 10 has the substrate 101, a foundation layer 102 provided on the substrate 101, a stack including first layers 103 and second layers 104 alternately stacked on the foundation layer 102, a conductive film 105 provided on the stack, a mask layer 106 provided on the conductive film 105, and an opening H which has an inner wall surface HA and a bottom surface HB and penetrates the conductive film 105 to expose a part of the stack. The foundation layer 102, the first layer 103, the second layer 104, the conductive film 105, and the mask layer 106 are examples of films to be processed which are provided on the substrate 101, and a configuration of the film to be processed is not limited to the above.

As the substrate 101, it is possible to use, for example, a silicon substrate, a semiconductor substrate such as a silicon carbide substrate, an insulation substrate such as a glass substrate, a quartz substrate, a sapphire substrate, or a compound semiconductor substrate such as a GaAs substrate.

As the foundation layer 102, it is possible to use an insulation film such as a silicon oxide film and a silicon nitride film, or a conductive layer between the insulation films, for example. The foundation layer 102 is not necessarily required to be provided, and in such a case, the first layer 103 is formed on the substrate 101. Further, the first layer 103 can be formed on the foundation layer 102.

The first layer 103 is a sacrificial layer. The sacrificial layer is a region where a conductive layer is formed later. As the first layer 103, a silicon nitride film can be used, for example.

As the second layer 104, a silicon oxide film can be used, for example.

As the conductive film 105, a carbon film (CVD carbon film) formed by a chemical vapor deposition (CVD) method can be used, for example.

The mask layer 106 has a function as a mask for etching a part of the conductive film 105. As the mask layer 106, an organic hard mask or the like can be used, for example. The mask layer 106 can be removed after a part of the conductive film 105 is removed.

[Etching Process]

(Configuration Example of Etching Apparatus)

Figure 3:
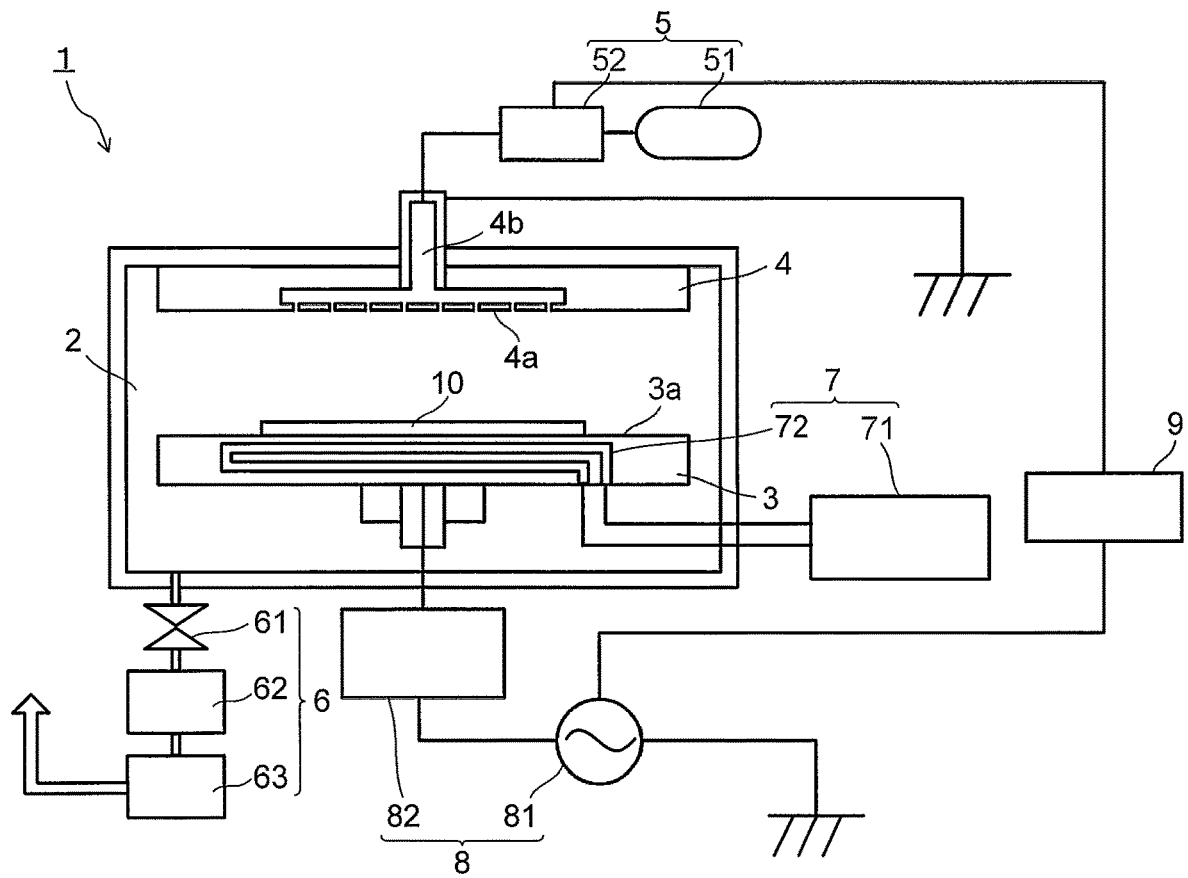
FIG. 3 is a schematic diagram illustrating a configuration example of a semiconductor manufacturing apparatus.

FIG. 3 is a schematic diagram illustrating a configuration example of a semiconductor manufacturing apparatus (etching apparatus) usable in the etching process. An etching apparatus 1 has a chamber 2, an electrode 3, an electrode 4, a gas supply 5, a gas discharger 6, a cooler 7, a power source 8, and a controller 9.

The chamber 2 is a space in which the target 10 can be etched (plasma etched) by sputtering using plasma. The chamber 2 can have a gate for carrying in and carrying out the target 10.

The electrode 3 is a lower electrode and has a function as a mounting table for mounting the target 10. The electrode 3 has a surface 3a being a mounting surface for the target 10. The etching apparatus 1 can have an electrostatic chuck for holding the target 10.

The electrode 4 is an upper electrode. The electrode 4 has a surface 4a and an opening 4b penetrating the electrode 4 to introduce gas into the chamber 2. The opening 4b has a plurality of introducing ports in the surface 4a.

The gas supply 5 has a gas supply source 51 such as a cylinder cabinet, and a mass flow controller 52. The gas supply 5 supplies gas from the gas supply source 51 to the chamber 2.

The gas supply source 51 houses a first gas (GAS1) and a second gas (GAS2). The first gas and the second gas are each stored in a container such as a gas cylinder.

The first gas contains a fluorine atom. The first gas can contain fluoride gas represented by a composition formula $C_xH_yF_z$ (C denotes carbon, H denotes hydrogen, F denotes fluorine, x denotes an integer equal to or larger than 1, y denotes an integer equal to or larger than 0, and z denotes an integer equal to or larger than 2). The second gas is different from the first gas, is gaseous at a temperature equal to or lower than a liquefaction temperature of the first gas, and includes inert gas such as argon gas and krypton gas, for example.

The mass flow controller 52 adjusts each of a flow rate of the first gas and a flow rate of the second gas which are introduced from the gas supply source 51 into the chamber 2.

The gas discharger 6 has a valve 61, a turbo molecular pump 61, and a dry pump 63. The gas discharger 6 has a function of vacuumizing the chamber 2 by reducing pressure of the inside thereof and a function of discharging gas inside the chamber 2.

The cooler 7 has a chiller 71 and a refrigerant pipe 72 inside the electrode 3, for example. The chiller 71 cools the target 10 by circulating refrigerant through the refrigerant pipe 72.

The power source 8 has a power supply 81 supplying alternating voltage and a matching circuit 82 such as a matching box. The power source 8 has a function of matching impedance between the chamber 2 and the power supply 81 by the matching circuit 82 to supply a radiofrequency voltage (RF) to the chamber 2. The radiofrequency voltage is alternative voltage having a frequency of 200 kHz or more and 200 MHz or less, for example.

The controller 9 controls the mass flow controller 52 and the power supply 81. The controller 9 is constituted by using hardware using a processor or the like, for example. Each operation can be saved as an operation program in a computer-readable recording medium such as a memory and executed by the operation program stored in the recording medium being read appropriately by the hardware.

(Etching Example)

The etching process includes, as illustrated in FIG. 1, a process of alternately switching a first step (S2-1) of forming a surface layer on a surface of the target 10 and a second step (S2-2) of etching the target 10 until an aspect ratio of the opening H becomes equal to or larger than a desired value, for example.

Figure 4:
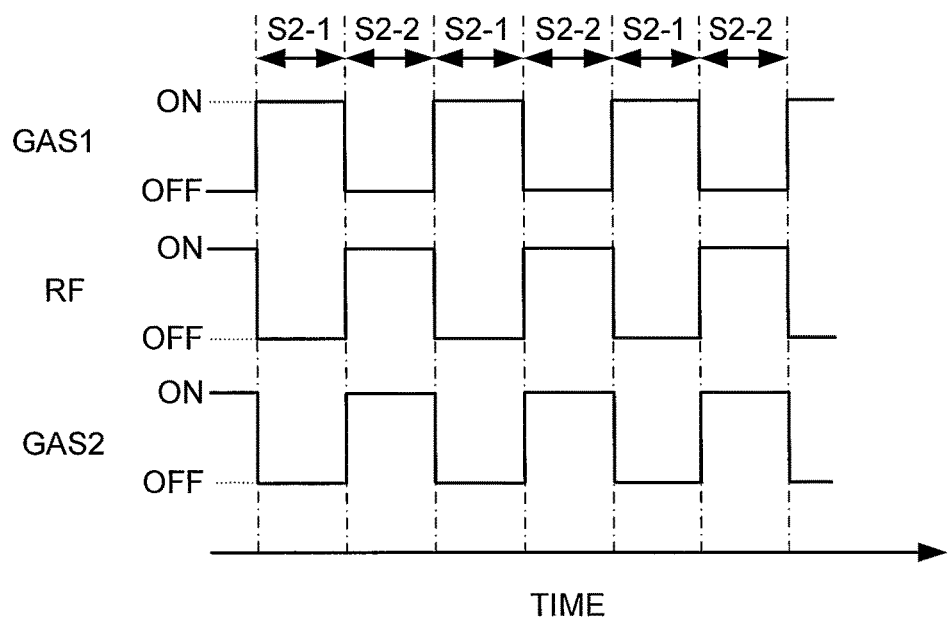
FIG. 4 is a timing chart for explaining an example of an etching method.

FIG. 4 is a timing chart for explaining an etching example. The first step (S2-1) and the second step (S2-2) are performed by controlling the mass flow controller 52 and the power supply 81 by the controller 9 and alternately switching a first operation of introducing the first gas (GAS1: ON) without supplying the radiofrequency voltage (RF: OFF) and a second operation of introducing the second gas (GS2: ON) and supplying the radiofrequency voltage (RF: ON).

In the first step (S2-1), the power supply 81 is controlled by the controller 9 so as not to apply the radiofrequency voltage between the electrode 3 and the electrode 4 in the chamber 2 by the power source 8, and the mass flow controller 52 is controlled by the controller 9 to introduce the first gas from the gas supply source 51 into the chamber 2 via the opening 4b. Before introducing the first gas, the mass flow controller 52 is controlled by the controller 9 to halt introduction of the second gas into the chamber 2 (GAS2: OFF).

Figure 5:
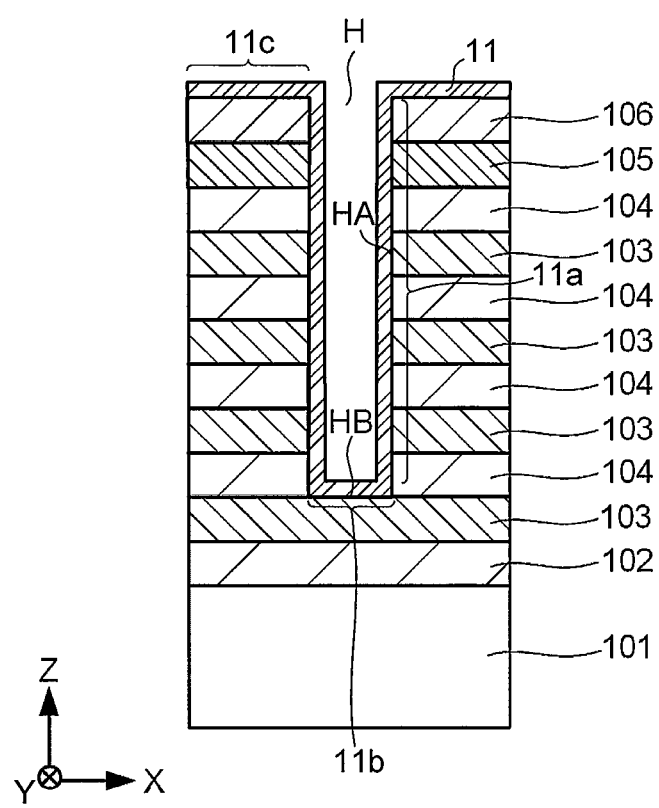
FIG. 5 is a cross-sectional schematic diagram for explaining a first step.

FIG. 5 is a cross-sectional schematic diagram for explaining the first step, which shows a part of the X-Z cross section. In the first step, the surface layer 11 is formed on the surface of the target 10 disposed on the surface 3a of the electrode 3 of the chamber 2. The surface layer 11 has a first region 11a extending along the inner wall surface HA of the opening H, a second region 11b extending along the bottom surface HB of the opening H, and a third region 11c extending along an upper surface of the mask layer 106 (top layer of the target 10).

The surface layer 11 is liquid or solid and contains a fluorine atom.

The surface layer 11 is formed by supplying of gas in a gas state not in a plasma or radical state and cooling of the target 10 at a temperature equal to or lower than a liquefaction temperature of the first gas by the cooler 7. The liquefaction temperature of the first gas can be determined non-ambiguously in accordance with a pressure of the chamber 2 and a vapor pressure curve of the first gas. The target 10 is preferably cooled at a temperature equal to or lower than −150° C., for example. The second gas is inert at the temperature equal to or lower than the liquefaction temperature of the first gas.

Figure 6:
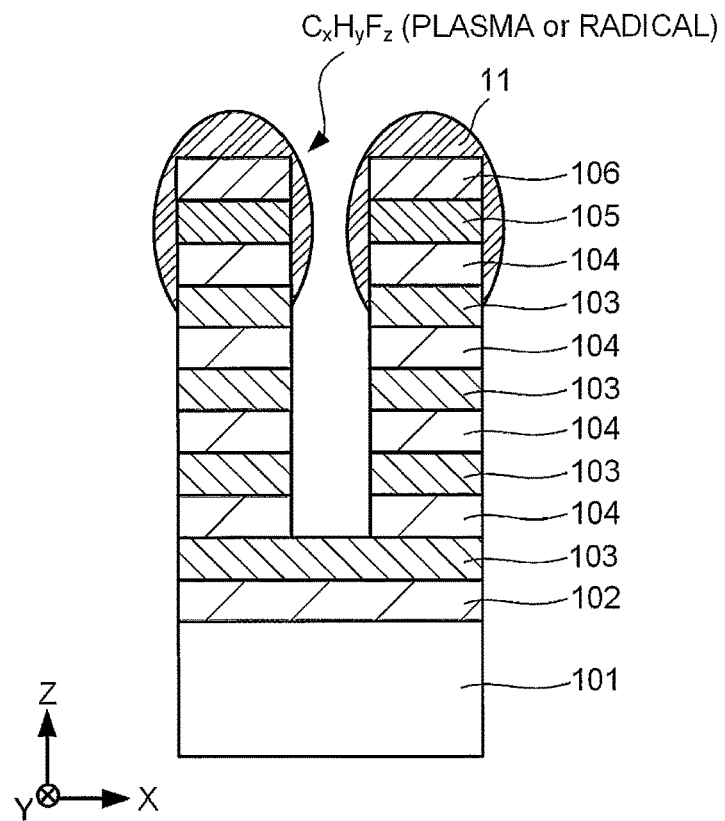
FIG. 6 is a cross-sectional schematic diagram for explaining a difference in shapes of a surface layer due to a difference in states of gas supplied to the target.
Figure 7:
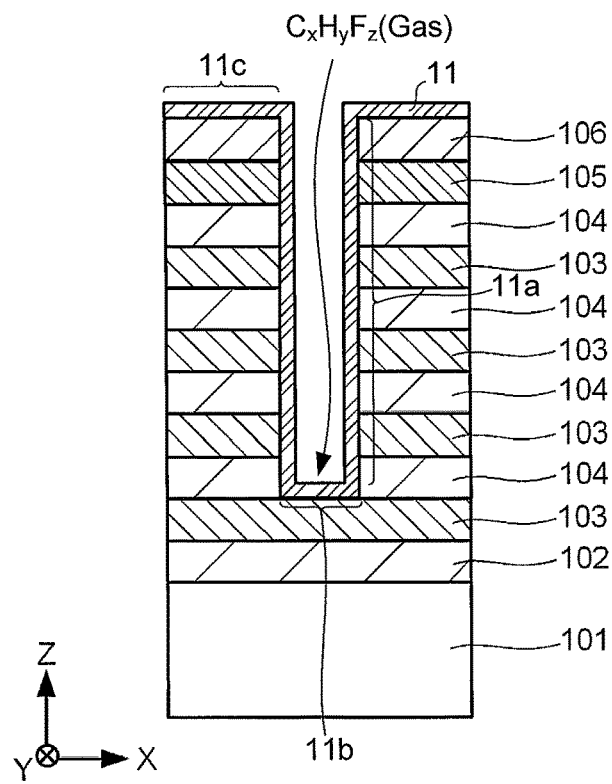
FIG. 7 is a cross-sectional diagram for explaining a difference in shapes of the surface layer due to a difference in states of gas supplied to the target.

FIG. 6 and FIG. 7 are cross-sectional schematic diagrams for explaining a difference in shapes of the surface layer 11 due to a difference in states of gas supplied to the target 10, which shows a part of the X-Z cross section.

In the first step, in a case where the radiofrequency voltage is supplied and plasma or radical is generated from the first gas, due to the fact that the plasma or radical of $C_xH_yF_z$ has an unpaired electron, steric hindrance around the unpaired electron is small, and the plasma or radical is likely to stick to the inner wall surface HA of the opening H and hard to reach the bottom surface HB. Further, because of a high sticking probability, the plasma or radical can be formed on the target 10 regardless of the liquefaction temperature of the first gas (for example, −70° C.). Thus, the surface layer 11 is, as illustrated in FIG. 6, formed thickly on an upper portion of the inner wall surface HA or an upper portion of the mask layer 106 and, in contrast, is hard to be formed on the bottom surface HB. In this case, since the bottom surface HB is hard to be etched, an etching rate is decreased.

In contrast, in a case where radiofrequency voltage is not supplied and the first gas not in the plasma or radical state is supplied in the first step, it is possible to make the first gas reach the bottom surface HB in the gas state. Further, by cooling the target 10 at a temperature (for example, −150° C.) equal to or lower than the liquefaction temperature of the first gas, the gas having reached the inner wall surface HA and the bottom surface HB becomes liquid or solid, so that the surface layer 11 is formed. Thus, since the surface layer 11 can be made easier to be formed on the bottom surface HB, the first region 11a to the third region 11c can be formed as illustrated in FIG. 7. In this case, since the bottom surface HB becomes easy to be etched by the second region 11b, the etching rate is improved.

In the second step (S2-2), the mass flow controller 52 is controlled by the controller 9 to introduce the second gas from the gas supply source 51 into the chamber 2 via the opening 4b, and the power supply 81 is controlled by the controller 9 to cause the power source 8 to apply radiofrequency voltage between the electrode 3 and the electrode 4 in the chamber 2. Before the second gas is introduced, the mass flow controller 52 is controlled by the controller 9 to halt introduction of the first gas into the chamber 2 (GAS1: OFF)

Figure 8:
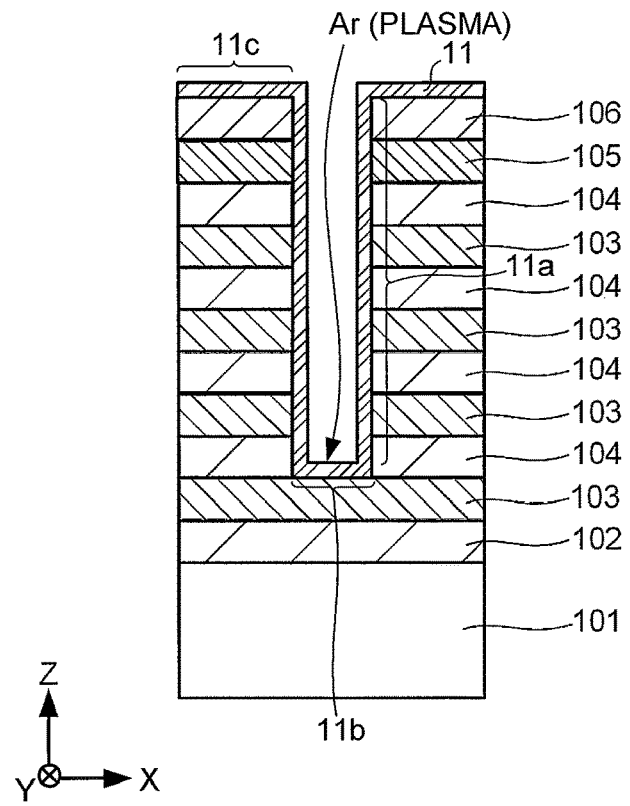
FIG. 8 is a cross-sectional schematic diagram for explaining a second step.

FIG. 8 is a cross-sectional schematic diagram for explaining the second step, which shows a part of the X-Z cross section. In the second step, plasma is generated from the second gas, and the target 10 and the surface layer 11 are etched by sputtering using plasma (argon plasma in FIG. 8).

The plasma moves toward the electrode 3. Thus, the first layer 103 and the second layer 104 are etched together with mainly the second region 11b and the third region 11c by the second step. Thereby, an aspect ratio of the opening H can be increased.

In the etching process, in the first step and the second step, it is possible to discharge the gas inside the chamber 2 by the gas discharger 6 before the first gas and the second gas are each introduced.

A period of the first step, a period of the second step, and a timing when the first step and the second step are switched can be controlled, for example, after a thickness of the surface layer 11 is monitored in-situ by using a measuring device such as an ellipsometer and data indicating each relationship of the thicknesses of the first region 11a to the third region 11c is acquired, in accordance with the aforementioned data. It is preferable, for example, that the first step and the second step are switched in accordance with the aforementioned data before etching is halted by lack of the surface layer 11.

As described above, by providing the first step of forming the surface layer and the second step of performing etching, synchronizing a period when radiofrequency voltage is not supplied and a period when the first gas is introduced, and alternately switching the first step and the second step, it is possible to improve the etching rate even in a case of forming an opening H of high aspect ratio, to thereby realize high-speed etching.

(Memory Layer Forming Process)

Figure 9:
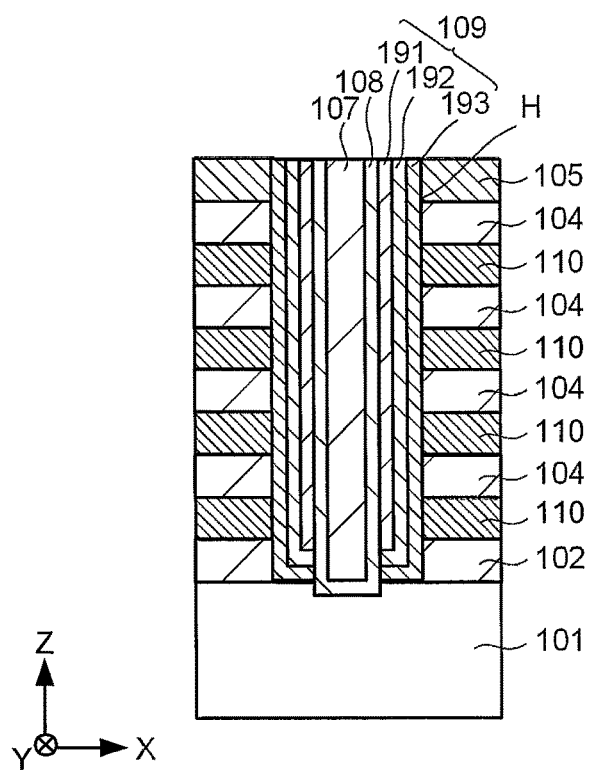
FIG. 9 is a cross-sectional schematic diagram for explaining a memory layer forming process.

FIG. 9 is a cross-sectional schematic diagram for explaining a memory layer forming process, which shows a part of the X-Z cross section. In the memory layer forming process, a memory film 109 which includes a block insulation film 193, a charge storage layer 192 and a tunnel insulation film 191, a semiconductor channel layer 108, and a core insulation film 107 are formed in this order in the opening H. The core insulation film 107, the semiconductor channel layer 108, and the memory film 109 function as a memory layer constituting a memory cell.

As the core insulation film 107, a silicon oxide film can be used, for example. As the semiconductor channel layer 108, a polysilicon layer can be used, for example. As the tunnel insulation film 191, a stacked film having a silicon oxide film and a silicon oxynitride film can be used, for example. As the charge storage layer 192, a silicon nitride film can be used, for example. As the block insulation film 193, a silicon oxide film can be used, for example.

After the memory film 109 is formed, the first layers 103 are removed, so that cavities are formed between the second layers 104, and a plurality of conductive films are stacked in the cavities to thereby form conductive layers 110. The conductive layer 110 has a function as a gate electrode (word line), for example. Further, a contact plug, a wiring, an interlayer insulation film, and so on are formed on the substrate 1. Thereby, a semiconductor device can be manufactured.

Second Embodiment

Figure 10:
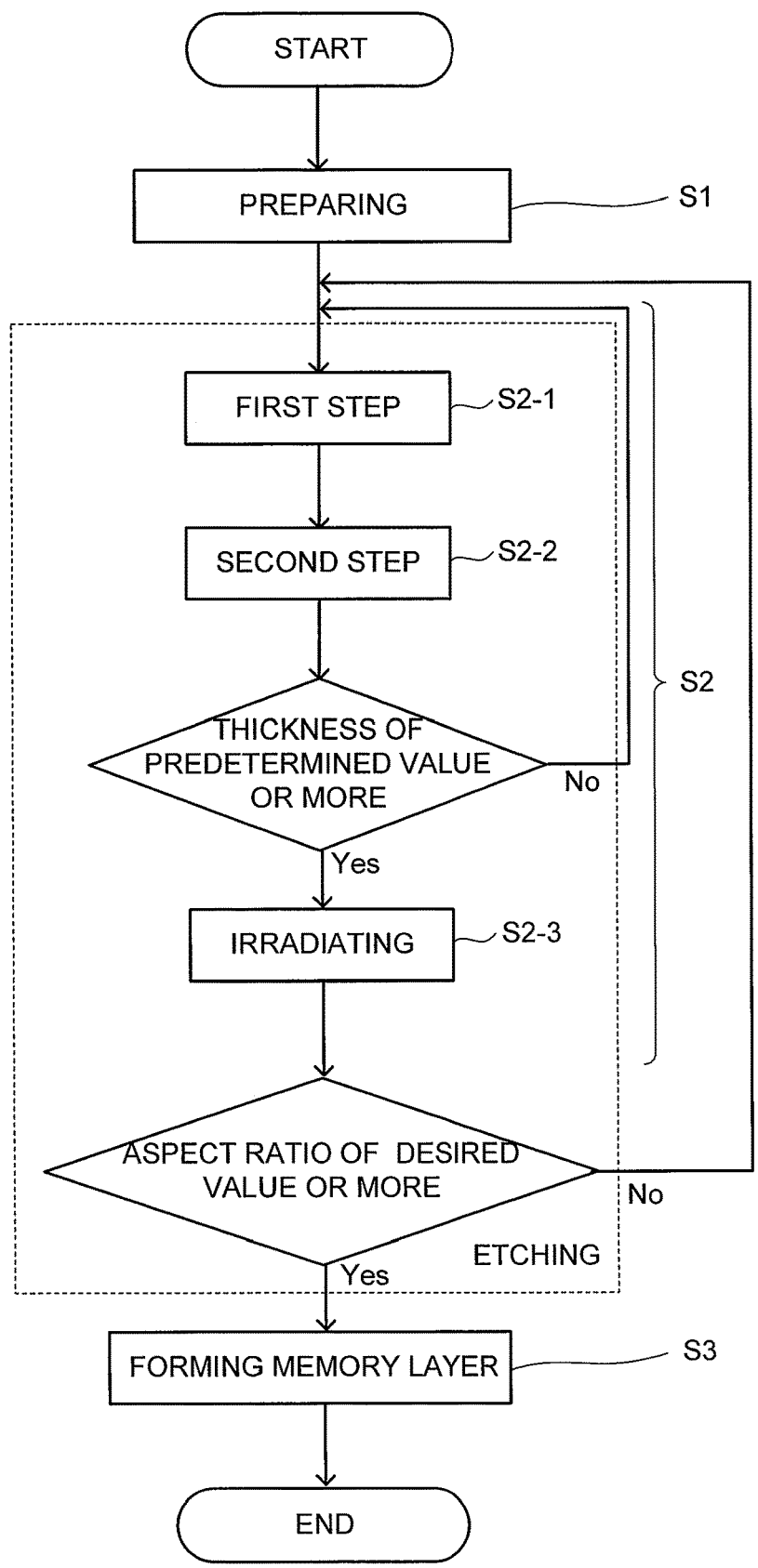
FIG. 10 is a flowchart for explaining another example of a method of manufacturing a semiconductor device.

FIG. 10 is a flowchart for explaining another example of a method of manufacturing a semiconductor device. The semiconductor device is a three-dimensional memory, for example. Another example of the method of manufacturing the semiconductor device includes a preparing process, (S1), an etching process (S2), and a memory layer forming process (S3). The preparing process and the memory layer forming process are the same as those in the first embodiment and explanation thereof will be omitted in this embodiment.

[Etching Process]

(Another Configuration Example of Etching Apparatus)

Figure 11:
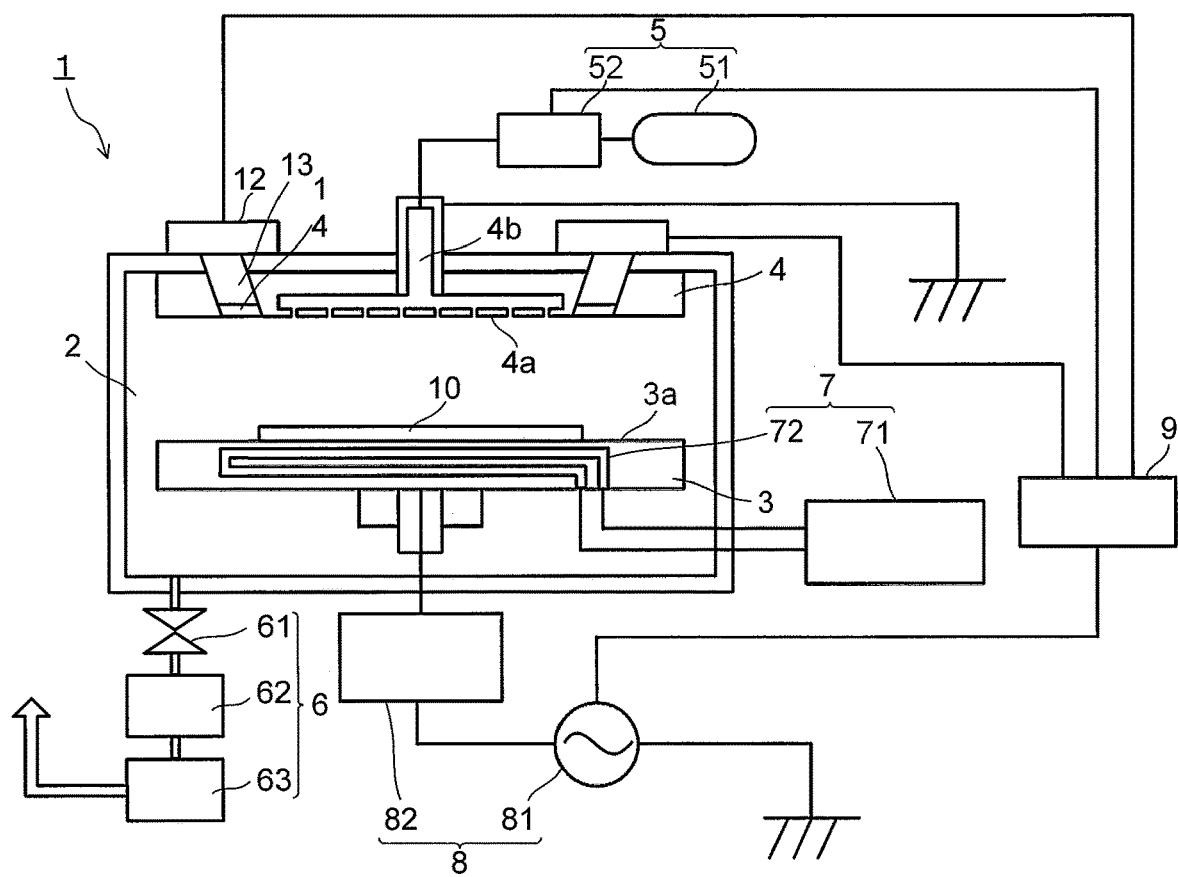
FIG. 11 is a schematic diagram illustrating another configuration example of the semiconductor manufacturing apparatus.

FIG. 11 is a diagram illustrating another configuration example of the semiconductor manufacturing apparatus usable in the etching process (etching apparatus). An etching apparatus 1 has a chamber 2, an electrode 3, an electrode 4, a gas supply 5, a gas discharger 6, a cooler 7, a power source 8, a controller 9, and a light source 12. Regarding the part the same as that of the etching apparatus 1 illustrated in FIG. 3, explanation of the first embodiment will be used accordingly.

The light source 12 has a function of irradiating light (L). The light source 12 is controlled by the controller 9. Examples of the light include infrared light, visible light, and ultraviolet light. The light from the light source 12 extends toward a surface 3a, passes through an optical waveguide 13 having a circular planer shape, and reaches a surface of a target 10, for example. The presence of a transmissive member 14 which transmits light which occlude the optical waveguide 13 can prevent deterioration of the light source 12 caused by plasma. Further, it is possible to clean the transmissive member 14 by performing a treatment such as oxygen plasma cleaning while maintaining a vacuum state of the chamber 2 after the etching process.

(Another Example of Etching)

The etching process includes, as illustrated in FIG. 10, a process of alternately switching a first step (S2-1) and a second step (S2-2) until an aspect ratio of an opening H reaches a desired value, for example, and, after the process of alternately switching the first step and the second step, an irradiating process (S2-3) of irradiating light (L) toward the target 10 in a case where a thickness of a first region 11a in the surface layer 11 becomes equal to or larger than a predetermined value, for example.

Figure 12:
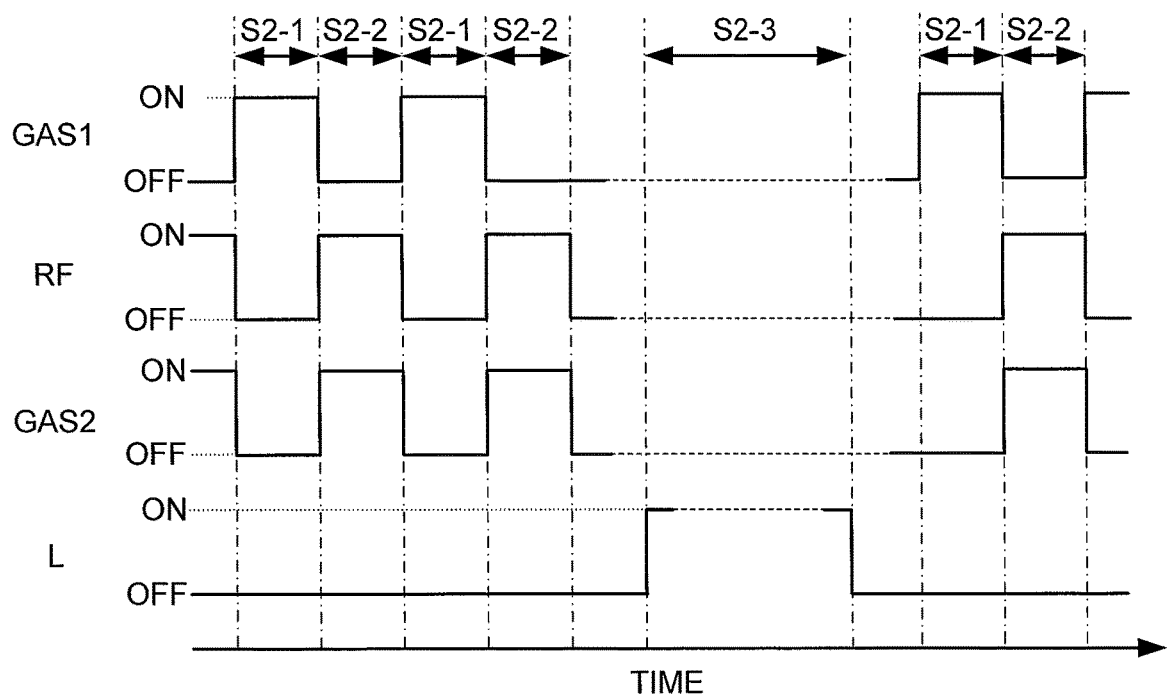
FIG. 12 is a timing chart for explaining another example of the etching method.

FIG. 12 is a timing chart for explaining another example of the etching. The first step (S2-1) and the second step (S2-2) are performed, similarly to in the etching example explained with reference to FIG. 4, by controlling a mass flow controller 52 and a power supply 81 by the controller 9 and alternately switching a first operation of introducing the first gas without supplying radiofrequency voltage and a second operation of introducing the second gas and supplying the radiofrequency voltage. Thus, the explanation for the first embodiment will be used accordingly.

The irradiating process (S2-3) is performed by controlling the light source 12 by the controller 9, and, after alternately switching the first operation and the second operation, controlling an operation of irradiating light (L: ON) toward the target 10. An irradiation time of light in the irradiating process is longer than a period of the first step or a period of the second step. The target 10 is preferably cooled at a temperature equal to or lower than a liquefaction temperature of the first gas also during the irradiating process. Further, irradiation of light is preferably halted in a period other than the irradiating process (L: OFF).

Figure 13:
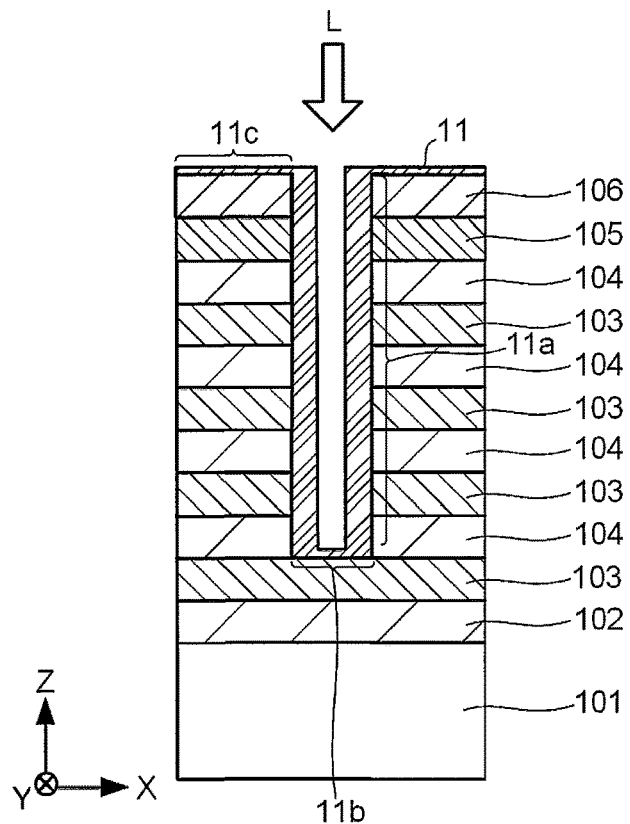
FIG. 13 is a cross-sectional schematic diagram for explaining an irradiating process.
Figure 14:
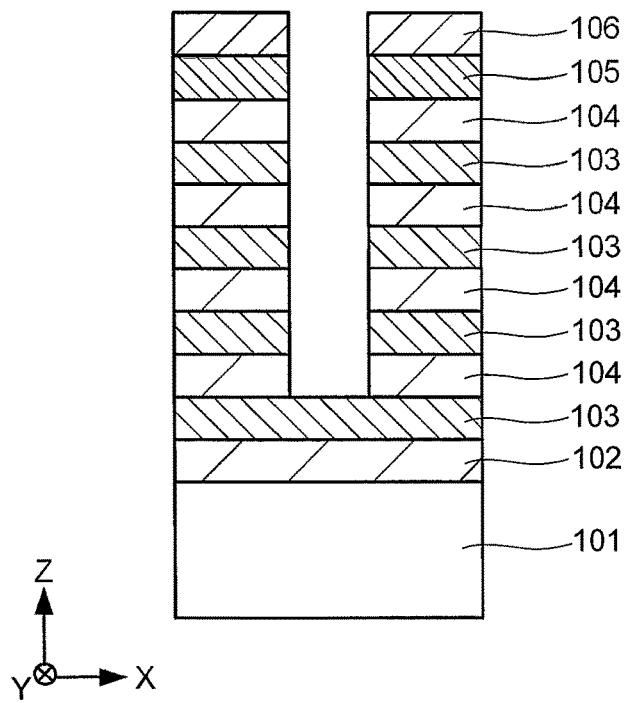
FIG. 14 is a cross-sectional schematic diagram for explaining the irradiating process.

FIG. 13 and FIG. 14 are cross-sectional schematic diagrams for explaining the irradiating process, which shows a part of an X-Z cross section. In the process of alternately switching the first step and the second step, in the surface layer 11, a second region 11b and a third region 11c which are almost vertical to a moving direction of plasma are preferentially consumed and likely to become thin. On the other hand, a first region 11a which is almost parallel to the moving direction of plasma is hard to be consumed and likely to become thick. Therefore, when switching of the first step and the second step is continued, there is a possibility that the first region 11a remains to thereby close the opening H.

In contrast, in the irradiating process, as illustrated in FIG. 13, light is irradiated from the light source 12 toward the target 10, to thereby enable vaporization and removal of a residue (including a residue of the first region 11a) of the surface layer 11 by heat as illustrated in FIG. 14. On this occasion, other layers such as a foundation layer 102, a first layer 103, a second layer 104, a conductive film 105 and a mask layer 106 do not absorb the irradiated light, so that they are not vaporized and remain.

A period of the irradiating process can be controlled, for example, after a thickness of the surface layer 11 is monitored in-situ by using a measuring device such as an ellipsometer and data indicating each relationship between thicknesses of the first region 11a to the third region 11c is acquired, in accordance with the aforementioned data. It is preferable, for example, that the irradiating process is performed when the thickness of the second region 11b becomes equal to or larger than a predetermined value.

As described above, in another example of the etching, by irradiating light toward the target 10 after the process of alternately switching the first step and the second step, the residue of the surface layer 11 can be removed to thereby prevent closing of the opening H. The process of alternately switching the first step and the second step can be performed again if the aspect ratio of the opening H is less than a desired value after the irradiating process.

In the first embodiment, the example is explained in which radiofrequency voltage is not supplied and the first gas not in the plasma or radical state is supplied, but the second embodiment is not limited thereto and it is possible to apply the above-described irradiating process even in a case where radiofrequency voltage is supplied and a surface layer derived from plasma or radical generated from the first gas is to be removed, for example.

Third Embodiment

Figure 15:
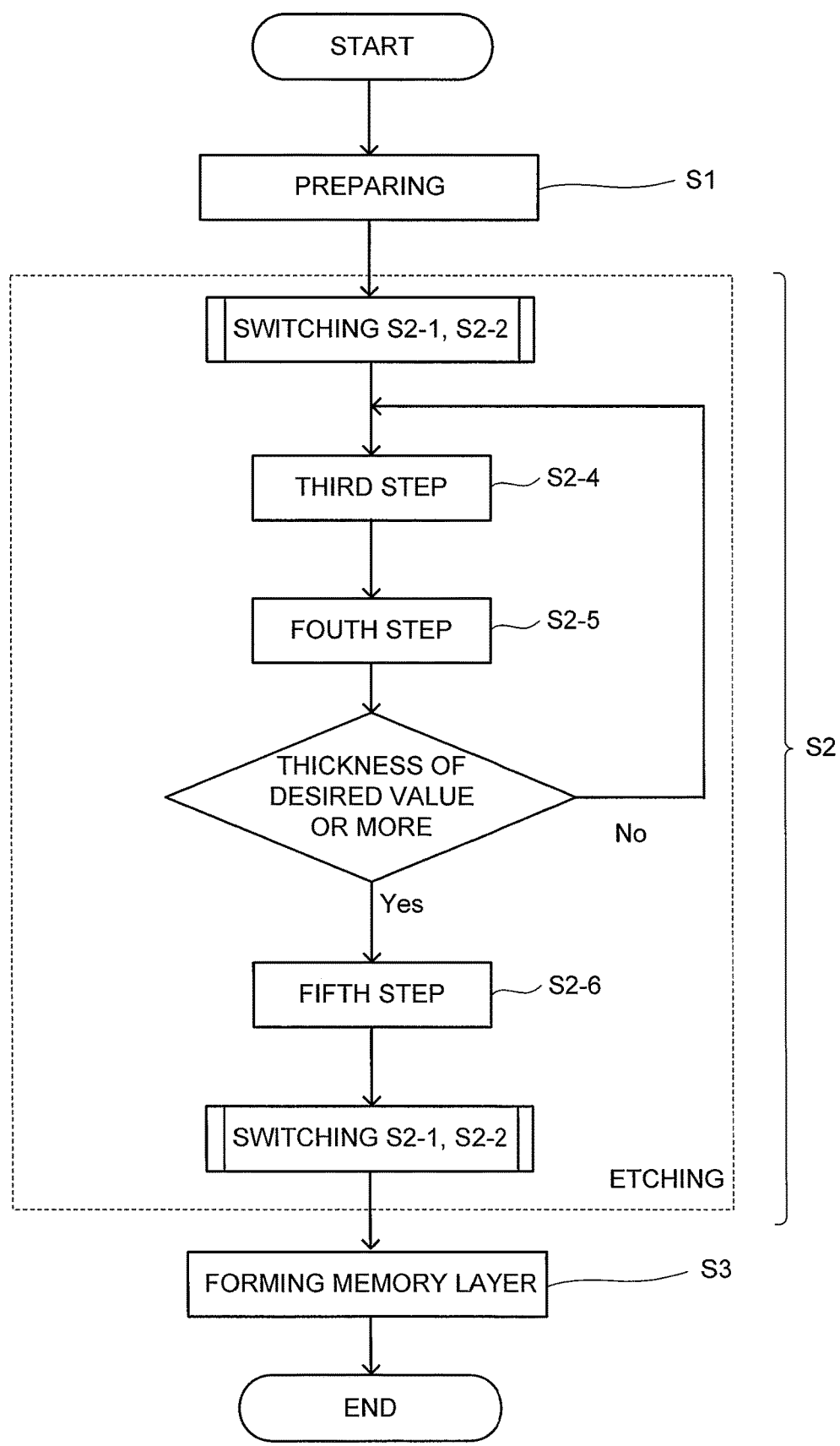
FIG. 15 is a flowchart for explaining another example of the method of manufacturing the semiconductor device.

FIG. 15 is a flowchart for explaining another method of manufacturing a semiconductor device. The semiconductor device is a three-dimensional memory, for example. Another example of the method of manufacturing the semiconductor device includes a preparing process, (S1), an etching process (S2), and a memory layer forming process (S3). The preparing process and the memory layer forming process are the same as those in the first embodiment and explanation thereof will be omitted in this embodiment.

[Etching Process]

(Another Configuration Example of Etching Apparatus)

Figure 16:
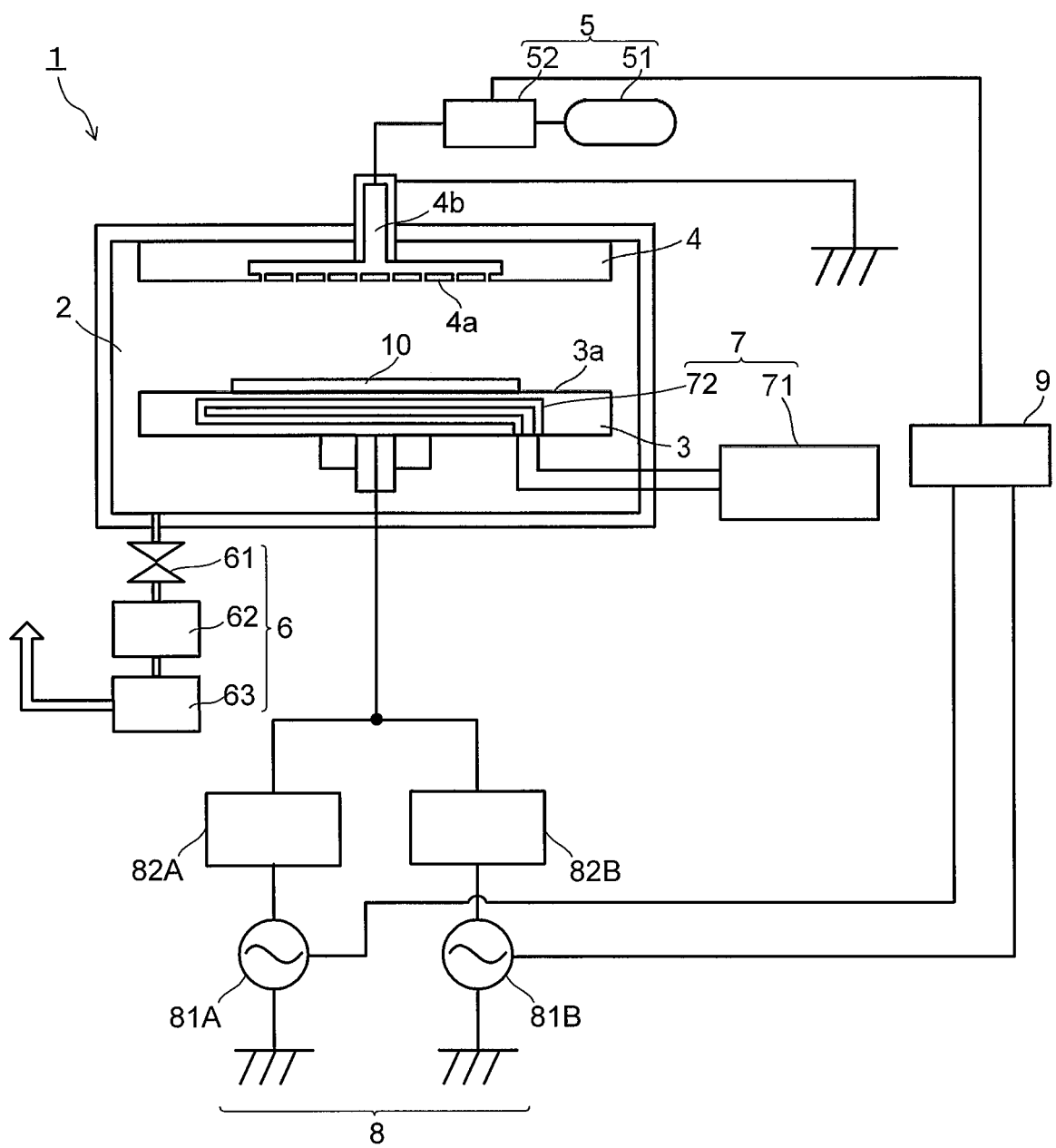
FIG. 16 is a schematic diagram illustrating another configuration example of the semiconductor manufacturing apparatus.

FIG. 16 is a diagram illustrating another configuration example of the semiconductor manufacturing apparatus usable in the etching process (etching apparatus). An etching apparatus 1 has a chamber 2, an electrode 3, an electrode 4, a gas supply 5, a gas discharger 6, a cooler 7, a power source 8, and a controller 9. Regarding the part the same as that of the etching apparatus 1 illustrated in FIG. 3, explanation of the first embodiment will be used accordingly.

The power source 8 includes a power supply 81A, a power supply 81B, a matching circuit 82A and a matching circuit 82B. The power supply 81A accords to the power supply 81, and has a function of matching impedance between the chamber 2 and the power supply 81A by the matching circuit 82A to supply a radiofrequency voltage (RF) to the chamber 2, the radiofrequency voltage having a frequency of 13.56 MHz or less. The power supply 81B has a function of matching impedance between the chamber 2 and the power supply 81B by the matching circuit 82B to supply a radiofrequency voltage (RF2) to the chamber 2, the radiofrequency voltage (RF2) having a frequency of 40 MHz or more. The power supplies 81A and 81B are connected to the controller 9.

The gas supply source 51 further houses a third gas (GAS3), a fourth gas (GAS4) and a fifth gas (GAS5). Each gas is stored in a container such as a gas cylinder. The third gas contains a hydrogen atom. The third gas can contain hydrogen sulfide ($H_2S$). Examples of the fourth gas can etch the target 10 and include a gas containing a hydrogen atom or an oxygen atom, a gas containing a halogen atom. Examples of the fifth gas include a gas containing silicon or tungsten such as $SiF_4$ or $WF_6$. Each gas is explained in more detail below.

The mass flow controller 52 adjusts each of a flow rate of the first gas, a flow rate of the second gas, a flow rate of the third gas and a flow rate of the fourth gas which are introduced from the gas supply source 51 into a processing chamber 2.

(Another Example of Etching)

The etching process includes, as illustrated in FIG. 15, a switching S2-1, S2-2 process of alternately switching the first step (S2-1) and the second step (S2-2) and a protection process of alternately switching a third step (S2-4) and a fourth step (S2-5) after the switching S2-1, S2-2 process to form a protection film which protect the inner wall surface HA of the opening H. As illustrated in FIG. 15, the switching S2-1, S2-2 process can be performed again after the protection process. The number of the switching times of the first and second steps and the switching times of the third and fourth steps are not limited. The third and fourth steps can be alternately switched until the thickness of the protection film becomes to a determined thickness.

Figure 17:
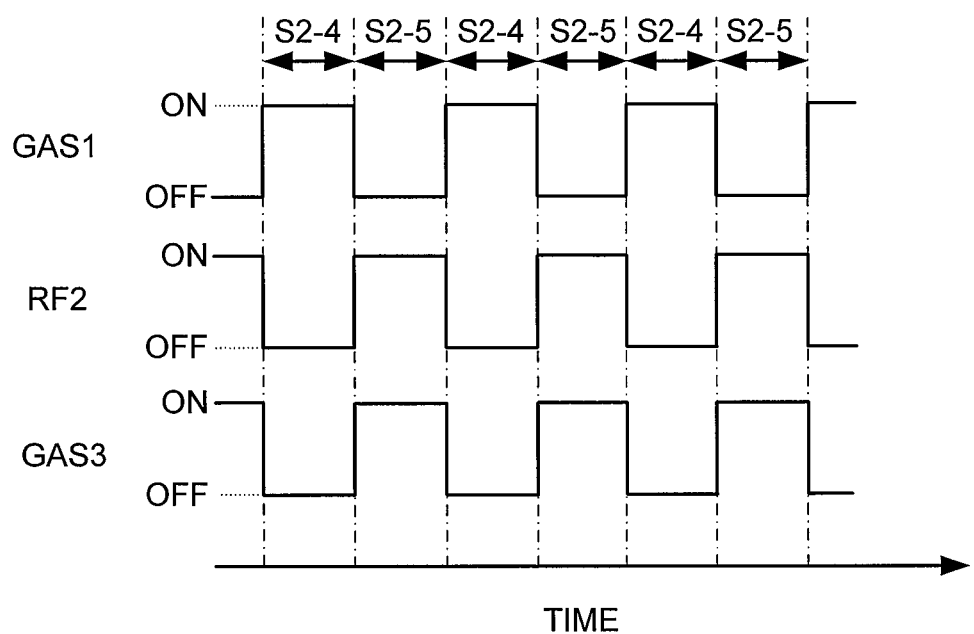
FIG. 17 is a timing chart for explaining an example of protecting process.

FIG. 17 is a timing chart for explaining another example of the etching. The third step (S2-4) and the fourth step (S2-5) are performed by controlling the mass flow controller 52, the power supply 81A, and the power supply 81B by the controller 9 and alternately switching a third operation of introducing the first gas (GAS1: ON) without supplying the radiofrequency voltages RF and RF2 and a fourth operation of introducing the third gas (GAS3: ON) and supplying the radiofrequency voltage RF2 (RF2: ON).

In the third step (S2-4), the power supply 81A and the power supply 81B are controlled by the controller 9 so as not to apply the radiofrequency voltages RF and RF2 between the electrode 3 and the electrode 4 in the chamber 2 by the power source 8, and the mass flow controller 52 is controlled by the controller 9 to introduce the first gas from the gas supply source 51 into the chamber 2 via the opening 4b.

The third step (S2-4) can supply the first gas not in a plasma or radical without the supplying the radiofrequency voltages RF and RF2 to reach the bottom surface HB in the gas state, in similar to the first operation according to the first embodiment. Further, by cooling the target 10 at a temperature (for example, −150° C.) equal to or lower than the liquefaction temperature of the first gas, the gas having reached the inner wall surface HA and the bottom surface HB becomes liquid or solid, so that the surface layer 11 is formed.

In the fourth step (S2-5), the mass flow controller 52 is controlled by the controller 9 to introduce the third gas from the gas supply source 51 into the chamber 2 via the opening 4b, and the power supply 81B is controlled by the controller 9 to cause the power source 8 to apply the radiofrequency voltage RF2 between the electrode 3 and the electrode 4 in the chamber 2. Before the third gas is introduced, the mass flow controller 52 is controlled by the controller 9 to halt introduction of the first gas into the chamber 2 (GAS1: OFF)

The fourth step (S2-5) can apply the radiofrequency voltage RF2 and introduce the third gas to remove fluorine from and to modify the surface layer 11 and thus form a protection film. The frequency of the radiofrequency voltage RF2 is higher than that of the radiofrequency voltage RF. This prevents a generation of a self-bias voltage.

In the fourth step (S2-5), the radiofrequency voltage RF2 can be applied with applying the he radiofrequency voltage RF. This modifies the surface layer 11 and removes the modified part of the second region 11b of the surface layer 11.

The etching process, as illustrated in FIG. 15, can further includes a fifth step (S2-6) before the switching S2-1, S2-2 process after the protection process. The fifth step (S2-6) is performed by carry out a fifth operation of controlling the mass flow controller 52 and a power supply 81A by a controller 9 to introduce the fourth gas and to apply the radiofrequency voltage RF.

In the fifth step (S2-5), the mass flow controller 52 is controlled by the controller 9 to introduce the fourth gas from the gas supply source 51 into the chamber 2 via the opening 4b, and the power supply 81A is controlled by the controller 9 to cause the power source 8 to apply the radiofrequency voltage RF between the electrode 3 and the electrode 4 in the chamber 2. Before the fourth gas is introduced, the mass flow controller 52 is controlled by the controller 9 to halt introduction of the third gas into the chamber 2.

Figure 18:
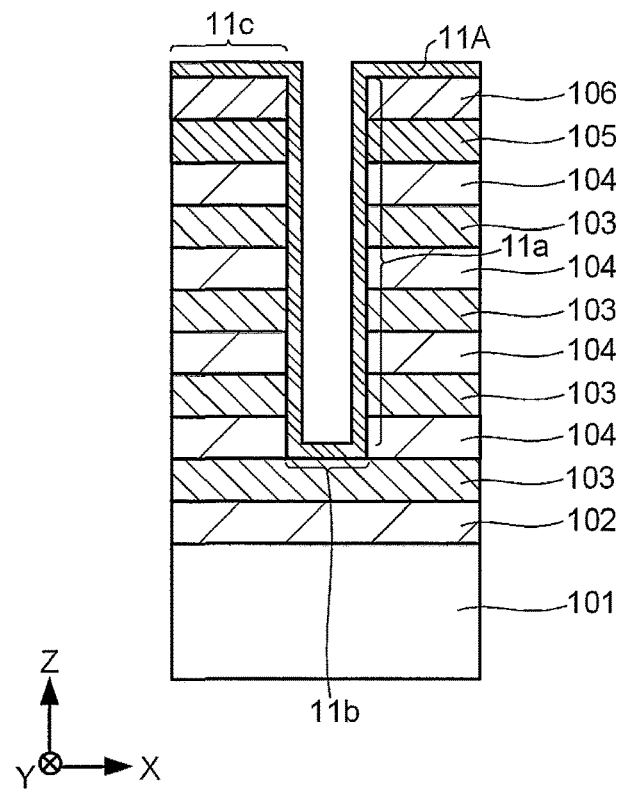
FIG. 18 is a cross-sectional schematic diagram for explaining a fourth step.
Figure 19:
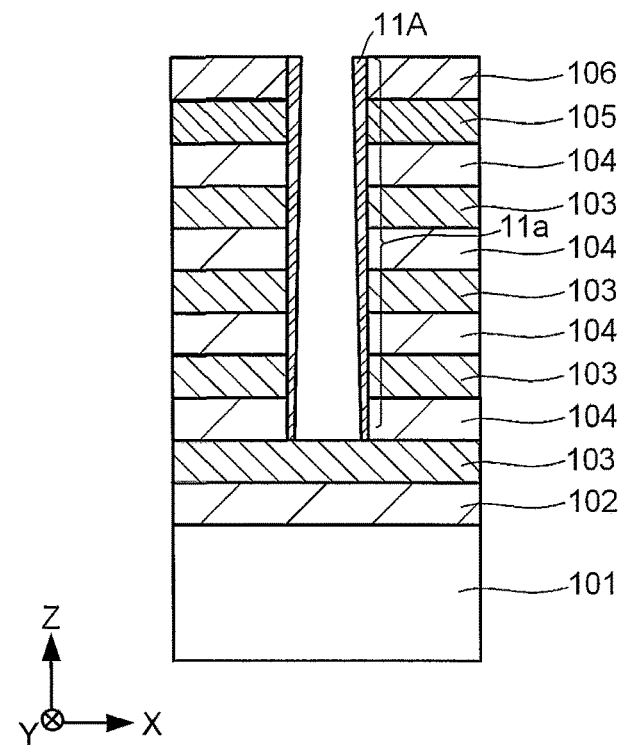
FIG. 19 is a cross-sectional schematic diagram for explaining a fifth step.

FIG. 18 is a cross-sectional schematic diagram for explaining the fourth step (S2-5), which shows a part of the X-Z cross section. FIG. 19 is a cross-sectional schematic diagram for explaining the fifth step (S2-6), which shows a part of the X-Z cross section. In the fourth step (S2-5), when radiofrequency voltage is supplied and plasma or radical is generated from the third gas, at least a part of the surface layer 11 is modified and a modified surface layer 11A is formed along the inner wall surface HA and the bottom surface HB of the opening H, as illustrated in FIG. 18. In contrast, the fifth step (S2-6) can remove the modified second and third regions 11b and 11c of the modified surface layer 11A, resulting in smoothly etching the opening H by the switching S2-1, S2-2 after the fifth step (S2-6).

The first, the second, the third and the fourth gas can respectively consists a gas containing the fluoride represented by a composition formula $C_xH_yF_z$, a gas containing a noble gas, a gas containing hydrogen, and a gas containing hydrogen or oxygen. In the third step (S2-4), the first gas can be replaced by a fifth gas. This replacement allows that the first, the second, the third, the fourth and the fifth gas can respectively correspond to a gas containing the fluoride represented by the composition formula $C_xH_yF_z$, a gas containing a noble gas, a gas containing hydrogen, a gas containing halogen, and a gas containing silicon or tungsten such as $SiCl_4$ or $SiF_4$, or $WF_6$, or the first, the second, the third, the fourth, and the fifth gas can respectively correspond to a gas containing the fluoride represented by the composition formula $C_xH_yF_z$, a gas containing a noble gas, a gas containing oxygen, a gas containing halogen, and a gas containing silicon or tungsten such as $SiCl_4$ or $SiF_4$, or $WF_6$.

The gas containing the noble gas contains He, Ne, Ar, Kr or Xe and is preferable for activation of the etching. The gas containing the hydrogen contains $H_2$, $H_2S$, $H_2O$, $NH_3$, HBr, HCl, HI or $SiH_4$ and is preferable for removal of fluorine. The gas containing the hydrogen or oxygen contains $H_2$, $H_2O$, $O_2$ or $CO_2$ and is preferable for removal of the modified part. The gas containing the halogen contains $Cl_2$, HBr, $CF_4$ or $C_4F_8$ and is preferable for removal of a film such as a silicon film or a silicon oxide film of the target 10. The gas containing the oxygen contains $O_2$, $H_2O$, NO, $NO_2$, CO or $CO_2$ and is preferable for oxidation of the surface layer 11.

When the third gas contains a hydrogen atom or an oxygen atom, a fluorine atom in the surface layer 11 can react the hydrogen or the oxygen atom to be removed from the surface layer 11. This forms the modified surface layer 11A enriched with carbon than the surface layer 11 to lowers the fluorine concentration of the modified surface layer 11A than the fluorine concentration of the surface layer 11. This prevents the inner wall surface HA of the opening H from being etched even though high-energy ions are implanted into the surface layer 11.

When the third step (S2-4) uses the fifth gas such as the gas containing $SiCl_4$, the fourth step (S2-5) pulls and removes a chlorine atom in a state of HCl from the surface layer 11 to form a silicon film which protect the inner wall surface HA. When the fourth step (S2-5) use the gas containing oxygen, the fourth step (S2-5) oxidizes the surface layer 11 containing $SiCl_4$ to form a silicon oxide film which protect the inner wall surface HA.

This embodiment modifies the surface layer 11 to increase the etching resistance of the surface layer 11 and thus prevent the inner wall surface HA from being etched. This enables easy formation of the opening having a high aspect ratio.

This embodiment can be combined with another embodiment accordingly.

Fourth Embodiment

Figure 20:
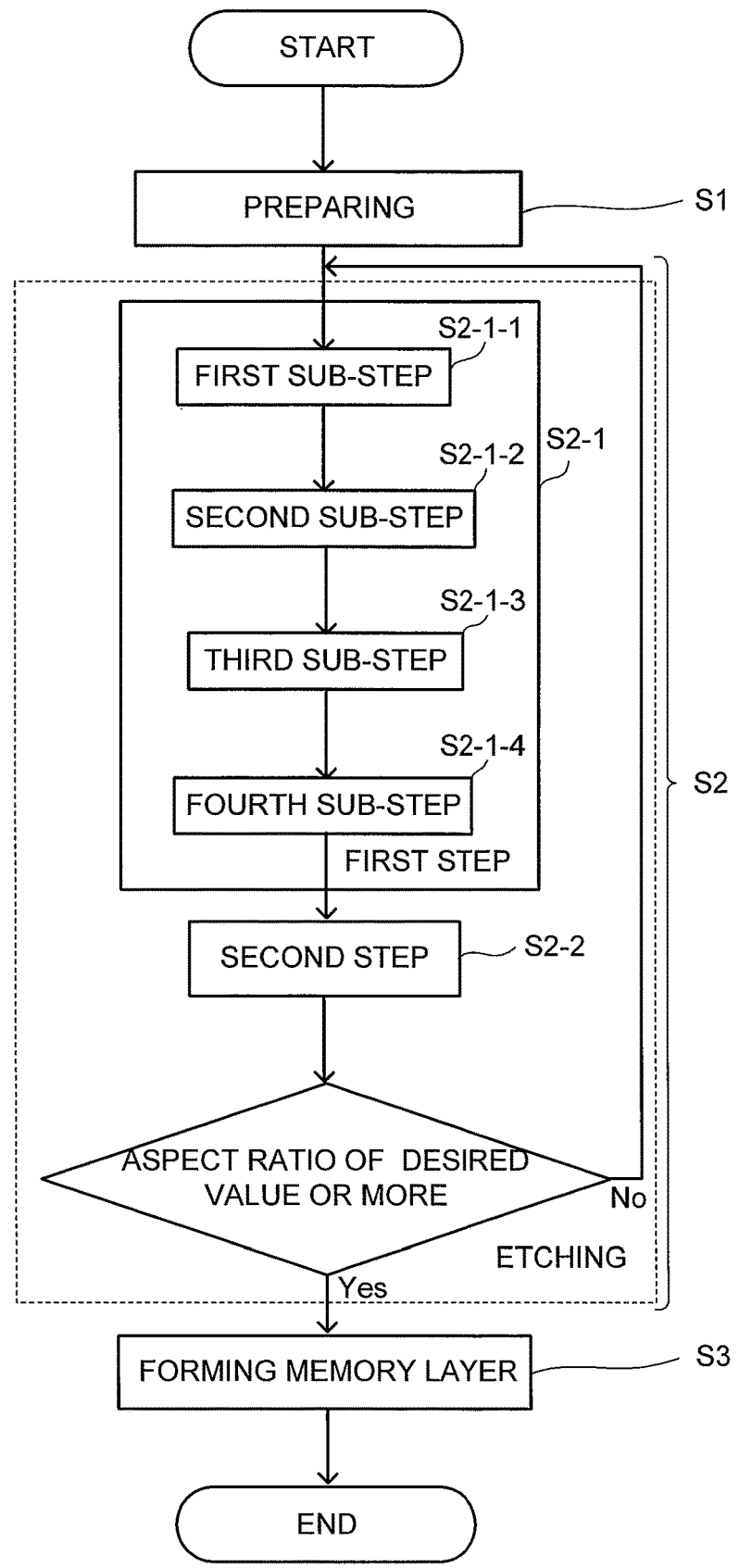
FIG. 20 is a flowchart for explaining another example of the method of manufacturing the semiconductor device.

FIG. 20 is a flowchart for explaining another example of a method of manufacturing a semiconductor device. The semiconductor device is a three-dimensional memory, for example. Another example of the method of manufacturing the semiconductor device includes a preparing process, (S1), an etching process (S2), and a memory layer forming process (S3). The preparing process and the memory layer forming process are the same as those in the first embodiment and explanation thereof will be omitted in this embodiment.

[Etching Process]

(Another Configuration Example of Etching Apparatus)

A semiconductor manufacturing apparatus (etching apparatus) usable in an etching process has the same components as the semiconductor manufacturing apparatus in the first embodiment. Regarding the part the same as that of the etching apparatus 1 illustrated in FIG. 3, explanation of the first embodiment will be used accordingly.

The semiconductor manufacturing apparatus of this embodiment can change a cooling temperature of a workpiece 10 and a pressure inside a processing chamber 2. The cooling temperature of the target 10 can be adjusted by controlling a cooling apparatus 7 by a controller 9, for example. The pressure inside processing chamber 2 can be adjusted by controlling a mass flow controller 52 by the controller 9, for example.

(Another Example of Etching)

The etching process includes, as illustrated in FIG. 20, a process of alternately switching a first step (S2-1) and a second step (S2-2) until an aspect ratio of an opening H reaches a desired value, for example, and the first step (S2-1) includes a first sub-step (S2-1-1), a second sub-step (S2-1-2), a third sub-step (S2-1-3), and a fourth sub-step (S2-1-4).

Figure 21:
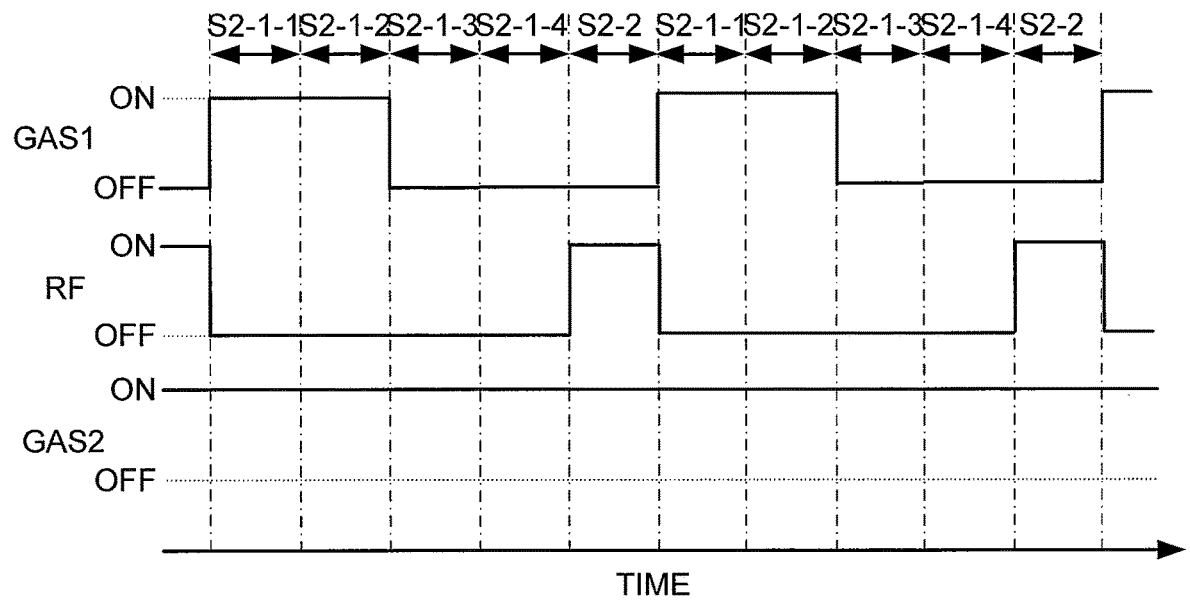
FIG. 21 is a timing chart for explaining another example of the etching method.

FIG. 21 is a timing chart for explaining another example of the etching. The first sub-step (S2-1-1) to the fourth sub-step (S2-1-4) are performed by controlling the cooling apparatus 7 and the mass flow controller 52 by the controller 9 to change the temperature and the pressure in accordance with a phase diagram of the first gas.

Figure 22:
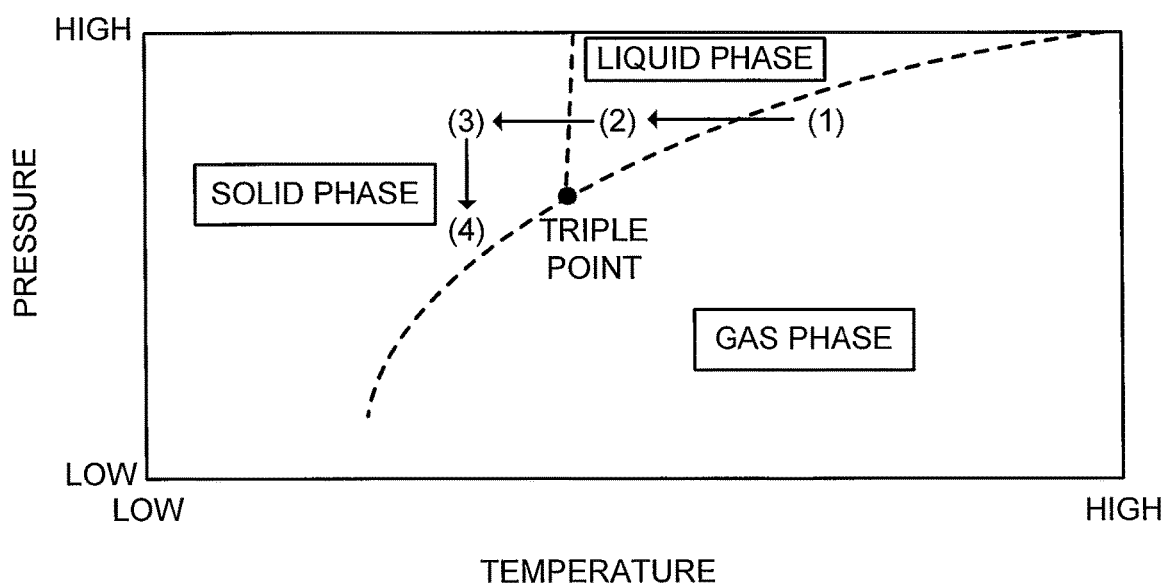
FIG. 22 is a phase diagram illustrating an example of a state of a first gas.

FIG. 22 is the phase diagram illustrating an example of a state of the first gas. The phase diagram of the first gas is depicted by a horizontal axis indicating a temperature and a vertical axis indicating a pressure, and has a gas phase region, a liquid phase region, a solid phase region, and a triple point of a gas phase, a liquid phase and a solid phase, as illustrated in FIG. 22.

In the first sub-step (S2-1-1), a power supply 81 is controlled by the controller 9 not to apply radiofrequency voltage between an electrode 3 and an electrode 4 of the processing chamber 2 by a power source 8 (RF: OFF), and the cooling apparatus 7 and the mass flow controller 52 are controlled by the controller 9 to introduce the first gas from a gas supply source 51 into the processing chamber 2 via an opening 4b at a first temperature and a first pressure in the solid phase region of the first gas ((1) in FIG. 22) (first sub-operation). The first temperature is higher than a temperature of the triple point, for example. The first pressure is higher than a pressure of the triple point, for example. The mass flow controller 52 is controlled by the controller 9 to introduce the second gas into the processing chamber 2 (GAS 2: ON). The second gas is preferably introduced into the chamber 2 during the first sub-step (S2-1-1) to the fourth sub-step (S2-1-4) and the second step (S2-2). This prevents a decrease of the pressure in the chamber 2.

In the second sub-step (S2-1-2), the power supply 81 is controlled by the controller 9 not to apply the radiofrequency voltage between the electrode 3 and the electrode 4 of the processing chamber 2 by the power source 8 (RF: OFF), and the cooling apparatus 7 and the mass flow controller 52 are controlled by the controller 9 to cool the target 10 at a second temperature lower than the first temperature and a second pressure in the liquid phase region of the first gas ((2) in FIG. 22) (second sub-operation).

In the second sub-step (S2-1-2), by cooling the target 10 at the second temperature and the second pressure in the liquid phase region of the first gas, a surface layer 11 of the liquid phase is formed on a surface of the target 10. The surface layer 11 of the liquid phase has higher fluidity than a surface layer 11 of the solid phase. Therefore, forming the surface layer 11 of the liquid phase makes it easier to form the surface layer 11 also on a bottom surface HB.

The second temperature is lower than the first temperature and higher than the temperature of the triple point, for example. The second pressure is preferably higher than the pressure of the triple point of the first gas. In a case of the second pressure lower than the pressure of the triple point, the first gas directly changes from the gas phase to the solid phase as the temperature reduces as shown in FIG. 22, so that forming of the liquid phase is difficult. Further, by increasing the pressure, the liquid phase region can be enlarged. The triple point of the first gas is different by every gas kind, and in a case of $CHF_3$ gas, the temperature of the triple point is −155° C., for example, and the pressure is 456 mTorr, for example. In a case of $C_4F_8$ gas, the temperature of the triple point is −40.04° C., for example. In the case of $CF_4$ gas, the temperature of the triple point is −183.5° C., for example. In the case of $SF_6$ gas, the temperature of the triple point is −49.445° C., for example. Since the triple point can deviate depending on the processing chamber 2 to be used and a measuring method of the temperature and the pressure, it is preferable to check the temperature and the pressure at which the phase changes in an apparatus to be used. The second pressure can be the same as the first pressure.

Figure 23:
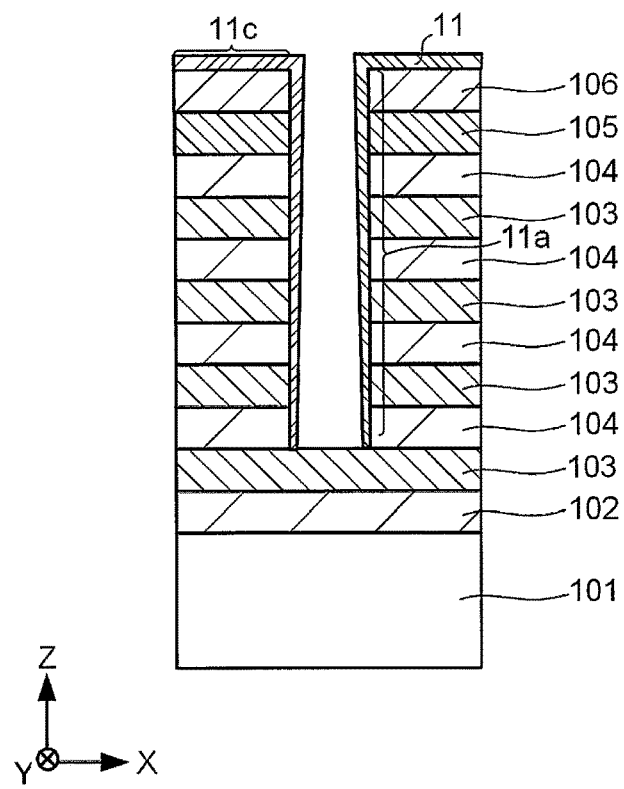
FIG. 23 is a cross-sectional schematic diagram for explaining a difference in shapes of a surface layer due to a difference in temperatures and pressures.
Figure 24:
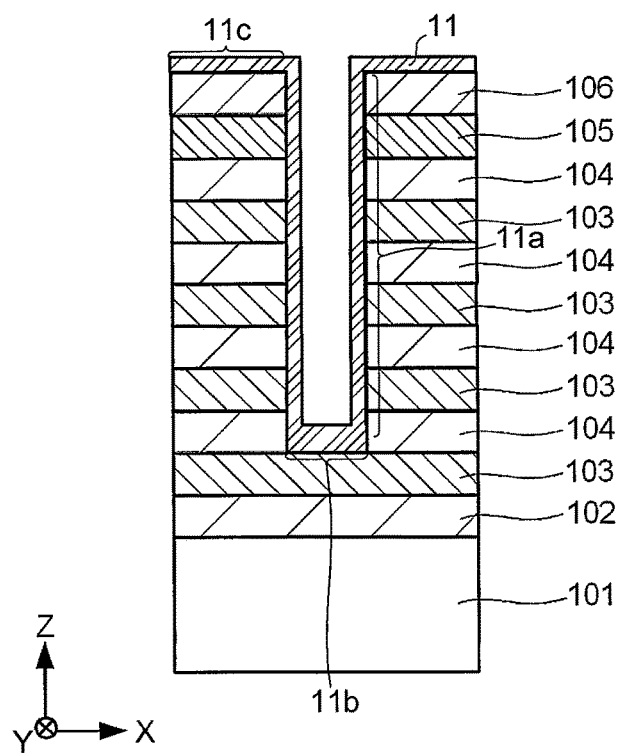
FIG. 24 is a cross-sectional schematic diagram for explaining the difference in shapes of the surface layer due to the difference in temperatures and pressures.

FIG. 23 and FIG. 24 are cross-sectional schematic diagrams for explaining differences in shapes of the surface layer 11 due to differences in temperatures and pressures, which each show a part of an X-Z cross section.

In a case where the surface layer 11 of the solid phase is formed in the solid phase region of the first gas in the second sub-step (S2-1-2), the solid phase of the surface layer 11 has low fluidity, so that the surface layer 11 (second region 11b) is hard to be formed on the bottom surface HB of the opening H, as illustrated in FIG. 23. In this case, since the bottom surface HB is hard to be etched, an etching rate is decreased.

In contrast, in a case where the surface layer 11 of the liquid phase is formed in the liquid phase region of the first gas in the second sub-step (S2-1-2), since the liquid phase of the surface layer 11 has high fluidity, the surface layer 11 can be formed thickly on the bottom surface HB as illustrated in FIG. 24, enabling formation of a first region 11a to a third region 11c. In this case, since the bottom surface HB becomes easy to be etched by the second region 11b, the etching rate is improved.

In the third sub-step (S2-1-3), the power supply 81 is controlled by the controller 9 not to apply radiofrequency voltage between the electrode 3 and the electrode 4 of the processing chamber 2 by the power source 8 (RF: OFF), and the cooling apparatus 7 and the mass flow controller 52 are controlled by the controller 9 to cool the target 10 at a third temperature lower than the second temperature and a third pressure in the solid phase region of the first gas ((3) in FIG. 22) (third sub-operation). The third temperature is lower than the temperature of the triple point, for example. The third pressure is higher than the pressure of the triple point, for example. The third pressure can be the same as the second pressure. The mass flow controller 52 is controlled by the controller 9 to halt the introduction of the first gas into the processing chamber 2 (GAS 1: OFF) in a predetermined period. FIG. 21 exemplifies that the introduction of the first gas into the processing chamber 2 is halted in the third sub-step (S2-1-3).

In the third sub-step (S2-1-3), by cooling the target 10 at the third temperature and the third pressure in the solid phase region of the first gas, the surface layer 11 of the solid phase is formed on the surface of the target 10. Since formation of the surface layer 11 of the liquid phase by the second sub-step (S2-1-3) enables formation of the surface layer 11 of the solid phase on the bottom surface HB by the third sub-step (S2-1-3), the first region 11a to the third region 11c can be formed.

In the fourth sub-step (S2-1-4), the power supply 81 is controlled by the controller 9 not to apply radiofrequency voltage between the electrode 3 and the electrode 4 of the processing chamber 2 by the power source 8 (RF: OFF), and the cooling apparatus 7 and the mass flow controller 52 are controlled by the controller 9 to cool the target 10 at a fourth temperature and a fourth pressure lower than the third pressure in the solid phase region of the first gas ((4) in FIG. 22) (fourth sub-operation). The fourth temperature is lower than the temperature of the triple point, for example. The fourth temperature can be the same as the third temperature. The fourth pressure is lower than the pressure of the triple point, for example.

In the second step (S2-2) after the fourth sub-step (S2-1-4), if plasma is generated while the third pressure being a high pressure is kept, uniformity of plasma is deteriorated and collision frequency inside a sheath is increased, so that ion energy is decreased. This hampers uniform etching of the target 10. In contrast, by lowering the pressure to the fourth pressure lower than the third pressure, uniform plasma can be generated.

Similarly to the etching example explained with reference to FIG. 4, the second step (S2-2) is performed by carrying out the second operation of controlling the cooling apparatus 7, the mass flow controller 52, and the power supply 81 by the controller 9 to introduce the second gas at the fourth temperature and the fourth pressure and to supply the radiofrequency voltage. Thus, explanation of the first embodiment will be used accordingly.

As described above, in another example of the etching, after the surface layer of the liquid phase is formed at the high pressure and the low temperature in the liquid phase region of the first gas, the target 10 is etched at the low pressure and the low temperature in the solid phase region of the first gas, whereby it is possible to improve the etching rate even in a case of forming the opening H of high aspect ratio, to thereby realize high-speed etching.

This embodiment can be combined with another embodiment accordingly.

Several embodiments of the present invention have been explained, but the above-described embodiments have been presented by way of example only, and are not intended to limit the scope of the invention. Those new embodiments can be embodied in a variety of other forms, and various omissions, substitutions and changes can be made without departing from the spirit of the invention. The above-described embodiments and their modifications are included in the scope and gist of the invention and are included in the invention described in claims and their equivalents.

What is claimed is:

1. An etching method comprising
    alternately switching a first step and a second step,
    the first step introducing a first gas containing a fluorine atom without supplying a radiofrequency voltage to form a surface layer on a surface of a target cooled at a temperature equal to or lower than the liquefaction temperature of the first gas; and
    the second step introducing a second gas gaseous at the temperature and different from the first gas with halting the introduction of the first gas, and supplying the radiofrequency voltage to generate plasma from the second gas and thus etch the target by sputtering using the plasma,
    wherein the introduction of the second gas is halted before the introduction of the first gas in the first step, and
    the first step is performed without the introduction of the second gas,
    wherein the etching method further comprises
    alternately switching a third step and a fourth step,
    the third step introducing the first gas without supplying the radiofrequency voltage, and
    the fourth step introducing a third gas containing a hydrogen atom and supplying the radiofrequency voltage to modify the surface layer.

2. The etching method according to claim 1, further comprising
    vaporizing a residue of the surface layer after the alternate switch between the first and second steps by irradiating light toward the target,
    wherein the light is infrared light, visible light, or ultraviolet light.

3. The etching method according to claim 1,
    wherein the first gas containing a fluorine atom is represented by a composition formula $C_xH_yF_z$, where C denotes carbon, H denotes hydrogen, F denotes fluorine, x denotes an integer equal to or larger than 1, y denotes an integer equal to or larger than 0, and z denotes an integer equal to or larger than 2.

4. The etching method according to claim 1, further comprising:
a fifth step of introducing a fourth gas different from the third gas and supplying the radiofrequency voltage to remove a modified part of the surface layer.

5. The method according to claim 1,
wherein the target has an opening on the surface, and the surface layer is formed on a bottom surface of the opening in the first step.

6. The method according to claim 1,
wherein the introduction of the first gas in the first step and the introduction of the second gas in the second step are alternately switched while the non-supply of the radiofrequency voltage in the first step and the supply of the radiofrequency voltage in the second step are alternately switched.

7. The method according to claim 1,
wherein the surface layer is liquid or solid.

8. An etching method comprising
alternately switching a first step and a second step,
the first step introducing a first gas containing a fluorine atom without supplying a radiofrequency voltage to form a surface layer on a surface of a target cooled at a temperature equal to or lower than the liquefaction temperature of the first gas; and
the second step introducing a second gas gaseous at the temperature and different from the first gas with halting the introduction of the first gas, and supplying the radiofrequency voltage to generate plasma from the second gas and thus etch the target by sputtering using the plasma,
wherein the introduction of the second gas is halted before the introduction of the first gas in the first step,
wherein the first step is performed without the introduction of the second gas,
wherein the first step includes:
a first sub-step of introducing the first gas at a first temperature and a first pressure in a gas phase region of the first gas, without supplying the radiofrequency voltage;
a second sub-step of cooling the target at a second temperature lower than the first temperature and a second pressure in a liquid phase region of the first gas, without supplying the radiofrequency voltage, to form the surface layer in liquid phase;
a third sub-step of cooling the target at a third temperature lower than the second temperature and a third pressure in a solid phase region of the first gas, without supplying the radiofrequency voltage to form the surface layer in solid phase;
a fourth sub-step of cooling the target at a fourth temperature and a fourth pressure lower than the third pressure in the solid phase region, without supplying the radiofrequency voltage, and
wherein the second step introduces the second gas and supplies the radiofrequency voltage to generate plasma from the second gas at the fourth temperature and the fourth pressure in the solid phase region and thus etch the target by sputtering using the plasma.

9. The etching method according to claim 8,
wherein the second pressure is higher than a pressure at a triple point of the first gas.

10. A method of manufacturing a semiconductor device, comprising:
preparing a target including a film above a semiconductor substrate; and
alternately switching a first step and a second step,
the first step introducing a first gas containing a fluorine atom without supplying radiofrequency voltage to form a surface layer on the target cooled at a temperature equal to or lower than the liquefaction temperature of the first gas, and
the second step introducing a second gas gaseous at the temperature and different from the first gas with halting the introduction of the first gas, and supplying the radiofrequency voltage to generate plasma from the second gas and thus etch the target by sputtering using the plasma,
wherein the introduction of the second gas is halted before the introduction of the first gas in the first step, and
the first step is performed without the introduction of the second gas,
wherein the method further comprises
alternately switching a third step and a fourth step,
the third step introducing the first gas without supplying the radiofrequency voltage,
the fourth step introducing a third gas containing a hydrogen atom and supplying the radiofrequency voltage to modify the surface layer.

11. The method according to claim 10, further comprising irradiating light toward the target to vaporize a residue of the surface layer after the alternate switch between the first and second steps.

12. The method according to claim 10,
wherein the first gas containing a fluorine atom is represented by a composition formula $C_xH_yF_z$
where C denotes carbon, H denotes hydrogen, F denotes fluorine, x denotes an integer equal to or larger than 1, y denotes an integer equal to or larger than 0, and z denotes an integer equal to or larger than 2.

13. The method according to claim 10, further comprising:
a fifth step of introducing a fourth gas different from the third gas and supplying the radiofrequency voltage to remove a modified part of the surface layer.

14. The method according to claim 10,
wherein the surface layer is liquid or solid.

* * * * *